(12) United States Patent
Ando

(10) Patent No.: US 7,834,412 B2
(45) Date of Patent: Nov. 16, 2010

(54) LOW DARK CURRENT IMAGE SENSORS BY SUBSTRATE ENGINEERING

(75) Inventor: Takashi Ando, Hartsdale, NY (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 212 days.

(21) Appl. No.: 12/076,300

(22) Filed: Mar. 17, 2008

(65) Prior Publication Data

US 2009/0230489 A1  Sep. 17, 2009

(51) Int. Cl.
*H01L 31/06* (2006.01)

(52) U.S. Cl. .............. 257/461; 257/432; 257/437; 257/E31.023; 438/72; 438/93

(58) Field of Classification Search ........... 257/461, 257/432, 437, E31.023; 438/72, 93
See application file for complete search history.

(56) References Cited

U.S. PATENT DOCUMENTS

| | | | |
|---|---|---|---|
| 5,130,170 A | * | 7/1992 | Kanai et al. ............... 427/575 |
| 7,030,918 B1 | * | 4/2006 | Nakashiba ................ 348/294 |
| 2002/0014643 A1 | * | 2/2002 | Kubo et al. ............... 257/290 |
| 2002/0093285 A1 | * | 7/2002 | Sugimoto et al. ......... 313/506 |
| 2004/0149330 A1 | * | 8/2004 | Sugiyama et al. ......... 136/249 |
| 2005/0145848 A1 | | 7/2005 | Mouli |
| 2005/0167709 A1 | | 8/2005 | Augusto |
| 2005/0184354 A1 | * | 8/2005 | Chu et al. .................. 257/458 |
| 2007/0001164 A1 | | 1/2007 | Cha |

* cited by examiner

*Primary Examiner*—Tu-Tu V Ho
(74) *Attorney, Agent, or Firm*—Rader, Fishman & Grauer PLLC

(57) ABSTRACT

Image sensors and the manufacture of image sensors having low dark current. A SiGe or Ge layer is selectively grown on the silicon substrate of the sensing area using an epitaxial chemical vapor deposition (CVD) method. After the SiGe or Ge growth, a silicon layer may be grown by the same epitaxial CVD method in an in-situ manner. This facilitates the formation of the hole accumulation diode and reduces the defect density of the substrate, resulting in device having a lower dark current.

16 Claims, 4 Drawing Sheets

LOW DARK CURRENT IMAGE SENSORS BY SUBSTRATE ENGINEERING

CROSS REFERENCE TO RELATED APPLICATIONS

This application is related to commonly assigned U.S. Application Ser. No. 12/076,299, filed on Mar. 17, 2008 by Takashi Ando, and entitled "Low Dark Current Image Sensor".

BACKGROUND OF THE INVENTION

1. Field of the Invention

This invention relates generally to image sensors and the manufacture of image sensors having low dark current and more particularly to CMOS and CCD imaging sensors having low dark current characteristics.

2. Description of the Related Art

Modern digital cameras employ either CCD (charge coupled device) or CMOS (complementary metal oxide semiconductor) image capture sensors. CCD and CMOS technologies offer alternative methods for capturing images onto digital media.

The architecture of the CCD is largely devoted to light capture and processing is done mostly off-chip. By contrast, CMOS sensor architecture is more complex than CCD architecture. Within CMOS imaging sensors, each pixel cell typically includes a circuit that transforms photons from a photoactive-diode to a digital charge. With each pixel doing its own conversion, the chip can be built to require less off-chip circuitry for basic operation.

While CCD and CMOS architecture differs, both CCD (charge-coupled device) and CMOS (complimentary metal-oxide semiconductor) image sensors convert light into electrons using a plurality of photoactive-diodes, also known as photo-diodes, cells, or photo-sites.

The photo-diodes are generally arranged in a 2-D lattice. Each photo-diode in the lattice transforms light into an electron charge. Within the lattice, each photo-diode corresponds to at least one pixel in the captured image. Photo-diodes exhibit a photoelectric effect, characterized by the ability of certain materials to release an electron when impacted by protons, thereby creating a charge. The more photons impact a given photo-diode, the more charge builds up. Each diode is bordered by a nonconductive boundary, which forces the charge to build while the diode is exposed to light from a camera aperture. In essence, each of the photo-diodes acts as a bucket, tracking the number of incoming photons making contact with the photo-diode. The accumulated charge in each diode is measured and recorded as a corresponding brightness value.

FIG. 1 illustrates a cross-sectional view of a conventional CMOS image sensor 1. This CMOS image sensor 1 exhibits high dark currents and defects caused by ion-implantation. CMOS image sensor 1 includes anti-reflection layer 5, a hole accumulation diode 10. The hole accumulation diode 10 includes a sensing area 20. A The sensing area 20 has p-type implantation species, such as boron, along the interface between the sensing area 20 and anti-reflection layer 5. The hole accumulation diode 10 is highly doped with p-type impurities in-situ formed by an epitaxial growth process. Anti-reflection layer 5 serves to prevent incoming photons from reflecting off the surface of the photo-diode, and thereby failing to register a charge. The anti-reflection layer 5 may be comprised of silicon nitride (SiN).

FIG. 2 is a schematic diagram illustrating an energy band diagram of the stacked structure of conventional CMOS image sensor 1, described in FIG. 1. The horizontal axis correspond to increasing depth of the CMOS image sensor 1, beginning at anti-reflection layer 5, p-type implantation 15 area, and sensing area 20. The vertical axis represents the energy band. Dashed line 50 represents the interface between the undoped and doped portions of sensing area 20. Energy bands 55 represent the range of band gap 65, having a mid-gap 60. A hole accumulation layer is formed at the surface of the sensing area 20 due to p-type implant species in doped layer 15. As a result, the energy bands 55 bend upward as they approach the interface between the anti-reflection layer 5 and the sensing area 20, which is a key to a low dark current. On the other hand, defects are introduced at the surface of the sensing area by the implantation process (shown by X'es in FIG. 2). These defects are the origins of dark current.

To reduce the dark current in the photo-diode, it may be beneficial to reduce the number of electrons at interface 50, thereby reducing the number of electrons entering sensing area 20. The conventional CMOS image sensor 1 attempts to do this by introducing the doped layer 15, however, electrons can pass through doped layer 15.

The CCD and CMOS are manufactured via a wafer fabrication process by which different electrical components and structures are formed on the silicon wafers. Fabrication encompasses a plurality of stages, including deposition, photolithography, etching, ion implantation, and annealing. Conventional photo-diodes have p-type doping (usually Boron) and are grown upon the substrate material.

During the deposition stage uniform coatings of thin films are applied to the wafers. Materials such as silicon dioxide, silicon nitride and polycrystalline silicon can be deposited onto the wafers using a variety of techniques, such as evaporation, chemical vapor deposition and sputtering. In particular, photo-diodes can be generated by forming epitaxial silicon layers using a process known as chemical vapor deposition.

Photolithography and etching are the processes by which structures are created on the wafers. Photolithography commonly employs UV sensitive chemicals to form masks, which acts as stencils. Etching techniques are used to remove materials that decompose during the photolithography process.

The doping process introduces ions into the fabricated surfaces, thereby adding impurities and changing the electrical properties of the material into which the ions are implanted. During the doping process, the wafers are bombarded with ions which are thereby implanted into the silicon. The number of ions implanted via the bombardment process is controlled in order to produce surface layers with specific electrical properties.

Alternatively, an epitaxial layer can be doped during deposition by adding impurities to the source gas, such as arsine, phosphine or diborane. The concentration of impurity in the gas phase determines its concentration in the deposited film. As in CVD, impurities change the deposition rate.

In the annealing process, wafers are heated for a specific amount of time in a conditioned atmosphere (inert, oxidizing, reducing). This process serves to remove impurities (such as oxygen) from the surface layers and cause implanted ions to diffuse further into the silicon (called "autodoping").

A common problem among imaging sensors is that even in the absence of light, some electrons will accumulate in the photo-diodes. This phenomenon is called "dark current." Dark current within image sensors degrades the performance of the produced image. These dark currents are not generated by incoming photons, but are randomly generated by thermal excitation, current leaks within the imaging device, or from various other possible sources. When charges buildup in the photo-diode, the dark current is indistinguishable from charge resulting from the photoactive effect. This causes the dark current to effectively brighten areas of the captured image, and unevenly reduces contrast between dark and lighter areas of the image. Because dark current electrons are random with respect to each imaging device, their effects on each photo-diode is unpredictable, and thereby produces noise in the resulting image which is difficult to remove. Therefore, in order to provide clearer contrast and reliable color dark currents should be minimized.

The prior art attempts to address this problem by forming a hole accumulation diode using an ion-implantation. However, this method requires high temperature processes, and therefore narrows the options for manufacturing processes. In addition the implantation process itself causes defects in the sensing area of the imaging device.

SUMMARY OF THE INVENTION

The present invention is directed to image sensors and the manufacture of image sensors having low dark current. The SiGe or Ge layer is selectively grown on the silicon substrate of the sensing area using an epitaxial chemical vapor deposition (CVD) method. After the SiGe or Ge growth, a silicon layer may be grown by the same epitaxial CVD method in an in-situ manner. This facilitates the formation of the hole accumulation diode and reduces the defect density of the substrate, resulting in the device having a lower dark current.

One embodiment may include an image sensor comprising a silicon substrate, a first layer of Ge or SiGe, a second layer of silicon, and an antireflection layer. The first layer may have a thickness between about 1-10 nm. The second layer may have a thickness between about 1-3 nm, and the anti-reflection layer may have a thickness of up to 100 nm. The first layer and the second layer may be grown using epitaxial chemical vapor deposition.

The image sensor may also include a peripheral circuit adjacent to the silicon substrate, first layer, and second layer. The sensor may also include a light shield disposed over the peripheral circuit, but under the anti-reflection layer. Finally, a color filter may be disposed over the anti-reflection layer and overlapping the silicon substrate.

Another embodiment may be directed to a process for manufacturing an image sensor. The process may include producing a silicon substrate, growing a first layer on the silicon substrate in-situ, and growing a second layer of silicon on the first layer in-situ. The first layer, second layer or both may be grown using epitaxial chemical vapor deposition.

The first layer may include a Ge or SiGe, and may be grown to a thickness between about 1-10 nm. In cases where the manufacturing process may employ temperatures of up to 500, pure Ge may be used. However, in cases where the process employs a maximum temperature between 500 to 1000° C., an SiGe having a Ge concentration between 10% and 40% may be used.

The present invention can be embodied in various forms, including business processes, computer implemented methods, computer program products, computer systems and networks, user interfaces, application programming interfaces, and the like.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

The present invention is directed to image sensors and the manufacture of image sensors having low dark current. The invention improves on pre-existing technologies by taking advantage of the narrower energy band gap of Ge and SiGe, as compared to imaging sensors employing conventional Si substrates.

Figure 1:
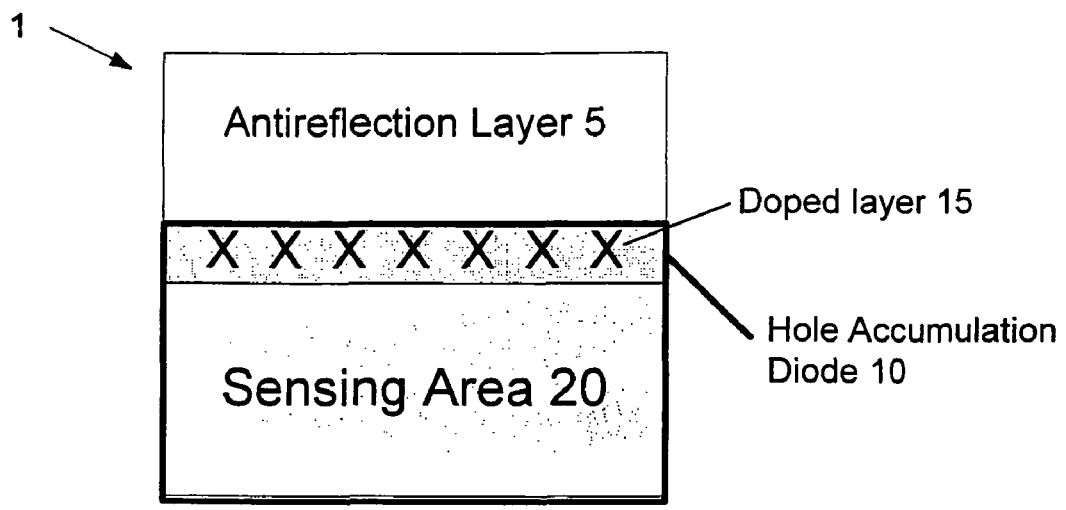
FIG. 1 is a schematic diagram illustrating a conventional hole accumulation diode.
Figure 2:
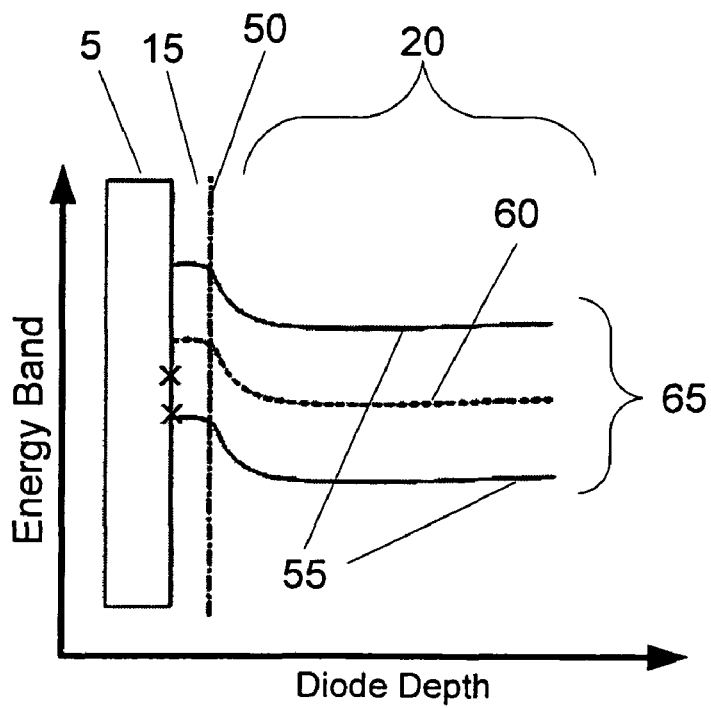
FIG. 2 is a graphical diagram illustrating energy bands in a conventional CMOS image sensor.
Figure 3:
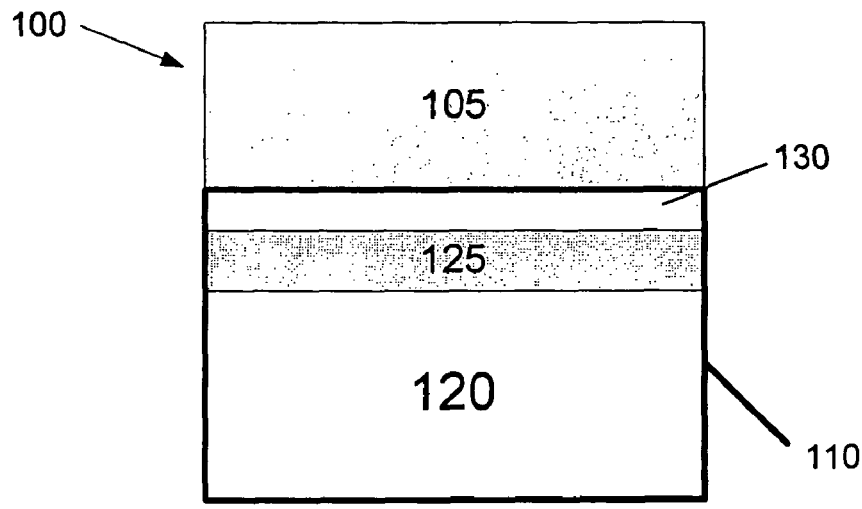
FIG. 3 is a schematic diagram illustrating an example of a hole accumulation diode in accordance with the present invention.

FIG. 3 illustrates an example embodiment of a low dark current image sensor 100 in accordance with the present invention. Image sensor 100 includes anti-reflection layer 105 and hole accumulation diode 110. The hole accumulation diode may include sensing area 120, first layer 125, and second layer 130. Sensing area 120 may be formed of silicon. The first layer 125 is a Silicon Germanium (SiGe) or Germanium (Ge) layer. The second layer 130 is a silicon cap layer, and is generally made of Silicon or $SiO_2$. Anti-reflection layer 105 may be comprised of silicon nitride (SiN).

Figure 4:
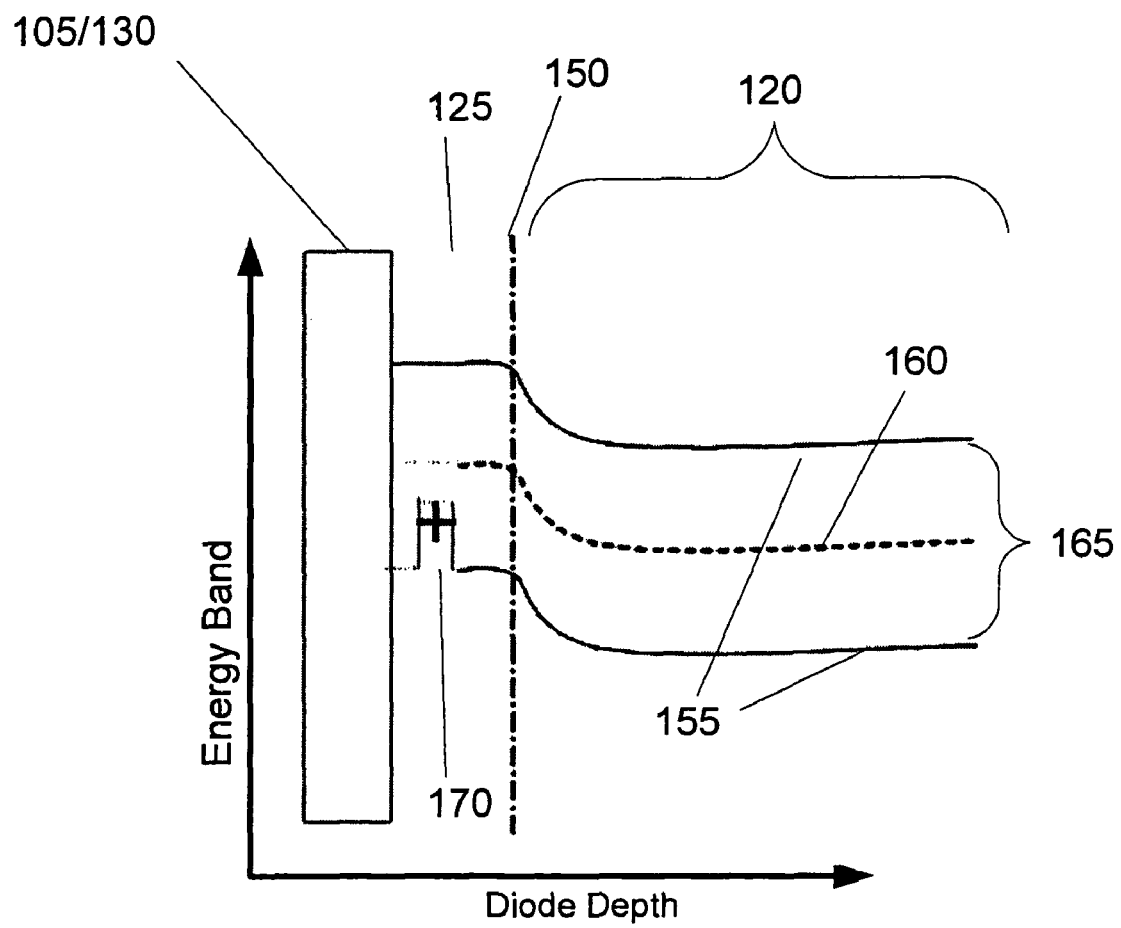
FIG. 4 is a graphical diagram illustrating energy bands in an example of a hole accumulation diode in accordance with the present invention.

FIG. 4 is a schematic illustrating an energy band diagram of the stacked structure described in FIG. 3, reflecting the benefit of employing SiGe or Ge as the first layer 125 in the hole accumulation diode. The horizontal axis correspond to increasing depth of the diode, passing through anti-reflection layer 105, second layer 130, first layer 125, and sensing area 120. Energy bands 155 represent the range for band gap 165, having a mid-gap 160. The energy bands 155 begin curving at interface 150 between sensing area 120 and doped layer 125. Dashed line 150 represents the interface between the sensing area 120 and first layer 125.

A hole accumulation layer is formed at the surface of the sensing area 110 (shown by a cross in FIG. 4) due to a narrower energy band gap of SiGe compared to Si. As a result, the energy bands 155 bend upward as they approach the interface between the first layer 125 and the sensing area 120, which is a key to reducing dark current.

As a result of the SiGe or Ge in first layer 125, hole charges 170 (positive charge) build up in the first layer 125. This is done without p-type implantation. The hole charge 170 reduces the electron density within sensing area 120, negating the effects of the dark current. In essence, the interface between the first layer 125 and second layer 130 creates a buffer that traps stray electrons attempting to enter the sensing area 120, thereby reducing dark current. Furthermore, the amount of p-type implant species can be reduced and the density of the interface defects becomes lower.

The first layer 125 may have a thickness of up to 10 nm and may be selectively grown on the silicon substrate of the sensing area 120 using an epitaxial chemical vapor deposition (CVD) method in-situ. Ge concentrations in the SiGe should be determined based on the thermal budget of the manufacturing process. If the fabrication process will reach temperatures of up to 1000° C., Ge concentration in the first layer 125 should be kept between 10% and 40%. If the process temperature will remain below 500° C., pure Ge can be used instead. In order to further facilitate the formation of the hole accumulation diode, SiGe or Ge can be doped with p-type species like boron or $BF_2$ in an in-situ manner.

The first layer 125 may be capped by the second layer 130 using an epitaxial chemical vapor deposition (CVD) method in-situ. The second layer 130 is a silicon cap, which may comprise an undoped silicon material and may be grown to a thickness of 3 nm.

Figure 5A:
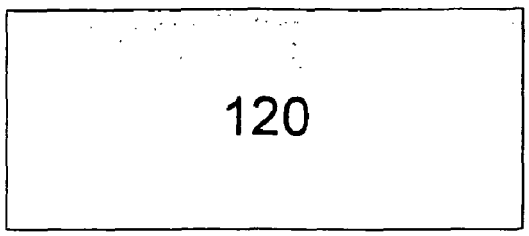
FIGS. 5A-5C illustrate a method for manufacturing a diode in accordance with the present invention.
Figure 5B:
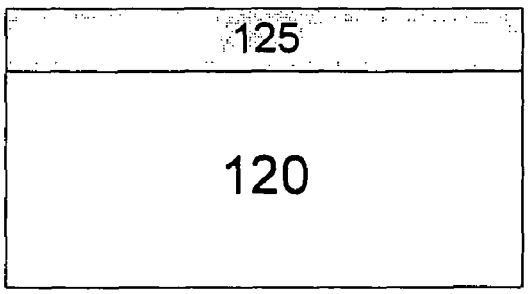
Figure 5C:
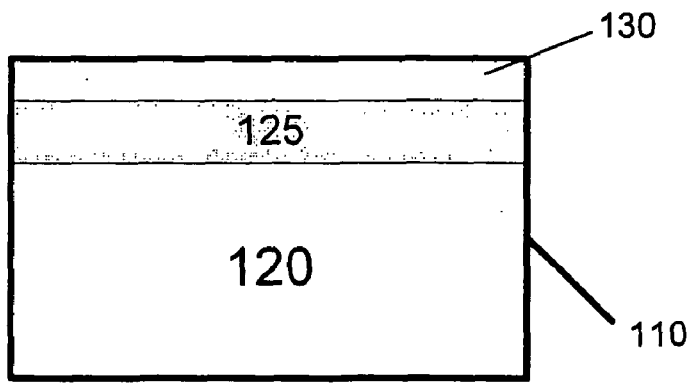

FIGS. 5A to 5C are cross-sectional views illustrating a method for fabricating a CMOS image sensor in accordance with the specific embodiment of the present invention.

FIG. 5A illustrates the silicon wafer comprising the sensing area 120 before any growth of the first layer 125 or second layer 130.

FIG. 5B illustrates the first layer 125 grown over the substrate 21 using an epitaxial growth process, such as CVD. The first layer 125 includes GE or SiGe and is doped with P-type impurities, e.g. boron. The first layer 125 is grown to a thickness ranging up to approximately 10 nm. Depending on the annealing process temperature, either SiGe or Ge may be used. If the annealing process has temperatures of up to 1000° C., then SiGe with a concentration level of Ge between 10 and 40% should be used. If the process temperature is below 500° C., pure Ge can be used instead.

After the epitaxial growth of the first layer 125, the imaging sensor passes through a furnace annealing process. The furnace annealing process is performed in a atmosphere of nitrogen ($N_2$), Hydrogen ($H_2$) or a combination of $N_2$ and $H_2$.

FIG. 5C illustrates the growth of the second layer 130, which is a silicon cap. The silicon cap is an undoped silicon layer grown via an epitaxial growth process over the first layer 125 also using an epitaxial CVD growth process, to a thickness ranging up to 3 nm, in an in-situ manner. While these layers are being formed, peripheral circuit areas should be covered by hard masks like $SiO_2$ or SiN to prevent growth of the first and second layer material over these peripheral circuits. After the steps described here, standard manufacturing processes of CMOS sensors or CCDs are applied.

Figure 6:
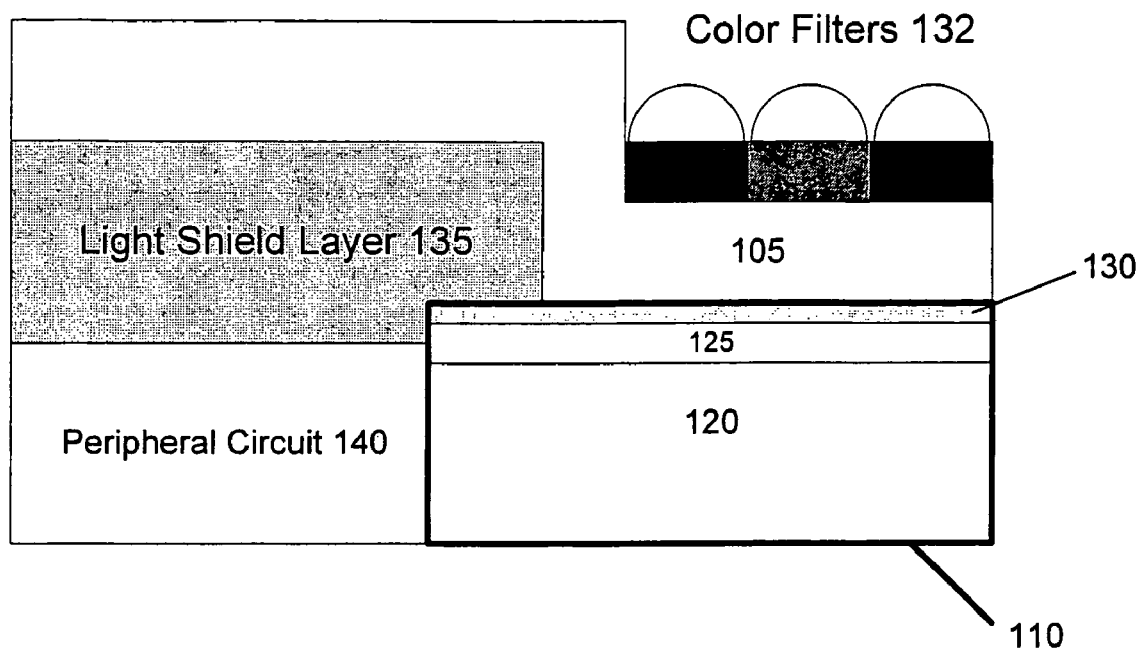
FIG. 6 is a schematic diagram illustrating an example of an image sensor that employs a hole accumulation diode.

FIG. 6 illustrates another schematic diagram of the image sensor in accordance with the present invention. The image sensor includes a hole accumulation diode 110, anti-reflection layer 105, color filters 125, light shield layer 135, and peripheral circuit 140. Peripheral circuit 140 is protected from light exposure by light shield 135. The hole accumulation diode may include sensing area 120, first layer 125, and second layer 130.

When the imaging sensor is exposed to a light source, light passes through color filters 132, anti-reflection layer 105, and into hole accumulation diode 110. As a result, the hole accumulation diode 110 develops a charge corresponding to the photons impacting the diode. Thereafter, the peripheral circuit 140 determines the accumulated charge produced by the hole accumulation diode 110 and converts the charge into a digital signal representing the amount of light impacting the imaging sensor. Light shield layer 135 provides protection to the peripheral circuit 140 from the photons.

While embodiments herein are discussed primarily with respect to three embodiments of an imaging sensor, the present invention is not limited thereto. For example, different materials or combinations thereof may be employed to form the various diode layers or as doping agents to the various diode layer, thereby allowing multiple variations is the techniques and methods for formation of the diodes.

Although embodiments of the invention are discussed primarily with respect to apparatuses and method manufacturing the imaging sensor and photo-diode, other uses and features are possible. Various embodiments discussed herein are merely illustrative, and not restrictive, of the invention. For example, different material, growth processes and doping agents can change the thermal stability and dark current exhibited by the imaging sensor.

Various embodiments of the present invention may provide important capabilities and features for electronic devices employing CMOS or CCD imaging sensors. Such capabilities and features include: greater freedom in manufacturing due to the variant thermal stabilities offered and reducing in dark current, leading to a reduction in the need to filter and otherwise compensate for noise within images. For example, the need to account for dark current via software solutions can be reduced or eliminated.

Those skilled in the art may construct imaging sensors by alter the chemistry of the imaging sensor to change the thermal or dark current exhibited in the disclosed image sensor without undue experimentation. Conventional systems for inducing changes in material chemistry may be adapted for use with embodiments of the present invention without departing from the scope thereof.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Thus embodiments of the present invention produce and provide systems and methods for low dark current imaging sensors. Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. An image sensor comprising:
   a silicon substrate;
   a first layer disposed on and in contact with the silicon substrate, the first layer, comprising at least one of a Ge or SiGe, doped with p-type impurities;
   a second layer disposed on and in contact with the first layer, comprising silicon;

an antireflection layer disposed on and in contact with the second layer.

2. The image sensor of claim 1, wherein the first layer has a thickness between about 1-10 nm.

3. The image sensor of claim 1, wherein the second layer has a thickness between about 1-3 nm.

4. The image sensor of claim 1, wherein at least one of the first layer and the second layer are grown using epitaxial chemical vapor deposition.

5. The image sensor of claim 1, wherein the first layer and the second layer are grown using epitaxial chemical vapor deposition.

6. An image sensor comprising:
a silicon substrate;
a first layer disposed on and in contact with the silicon substrate, the first layer, comprising at least one of a Ge or SiGe, doped with p-type impurities;
a second layer disposed on and in contact with the first layer, comprising silicon;
a peripheral circuit disposed on and in contact with the silicon substrate, first layer, and second layer;
a light shield disposed on and in contact with the peripheral circuit; and
an anti-reflection layer disposed on and in contact with the second layer and light shield.

7. The image sensor of claim 6, further comprising a color filter disposed over the anti-reflection layer and overlapping the silicon substrate.

8. The image sensor of claim 6, wherein the first layer has a thickness between about 1-10 nm.

9. The image sensor of claim 6, wherein the second layer has a thickness between about 1-3 nm.

10. The image sensor of claim 6, wherein at least one of the first layer and the second layer are grown using epitaxial chemical vapor deposition.

11. The image sensor of claim 6, wherein the first layer and the second layer are grown using epitaxial chemical vapor deposition.

12. The image sensor of claim 6, wherein a portion of the light shield overlaps a portion of the second layer.

13. The image sensor of claim 1, wherein the first layer is doped with one of boron or $BF_2$.

14. The image sensor of claim 1, wherein the second layer does not contain Ge.

15. The image sensor of claim 6, wherein the first layer is doped with one of boron or $BF_2$.

16. The image sensor of claim 6, wherein the second layer does not contain Ge.

\* \* \* \* \*